United States Patent
Suzuki

[19]

[11] Patent Number: 5,999,054
[45] Date of Patent: Dec. 7, 1999

[54] DIFFERENTIAL AMPLIFIER CIRCUIT

[75] Inventor: Hisao Suzuki, Kasugai, Japan

[73] Assignee: Fujitsu Limited, Kawasaki, Japan

[21] Appl. No.: 09/060,979

[22] Filed: Apr. 16, 1998

[30] Foreign Application Priority Data

Nov. 19, 1997 [JP] Japan ..................... 9-318168

[51] Int. Cl.$^6$ ..................................... H03F 3/45
[52] U.S. Cl. ........................... 330/255; 330/260
[58] Field of Search .................... 330/252, 253, 330/255, 9, 260

[56] References Cited

U.S. PATENT DOCUMENTS

| | | | |
|---|---|---|---|
| 4,410,857 | 10/1983 | Olmstead | 330/253 |
| 4,897,612 | 1/1990 | Carroll | 330/255 |

FOREIGN PATENT DOCUMENTS

| | | |
|---|---|---|
| 0 765 029 A2 | 3/1997 | European Pat. Off. . |
| 58-111415 | 7/1983 | Japan . |

OTHER PUBLICATIONS

"Amplifier with Output Voltage Near to VSS", Research Disclosure, No. 391, Nov. 1996, p. 751, XP000680940.

*Primary Examiner*—Robert Pascal
*Assistant Examiner*—Patricia T. Nguyen
*Attorney, Agent, or Firm*—Armstrong, Westerman, Hattori, Mcleland & Naughton

[57] ABSTRACT

A differential amplifier circuit including a differential input circuit which receives first and second input signals. The differential input circuit amplifies a potential difference between the input signals and outputs first and second voltage signals representing the potential difference. The first and second voltage signals are connected, respectively, to first and second output transistors. The first and second output transistors are serially connected to each other between a first supply voltage and a second supply voltage. A node between the first and second output transistors provides an output terminal. A control circuit receives the first and second voltage signals and controls the drain current of the first output transistor based on a difference between the first and second voltage signals.

17 Claims, 4 Drawing Sheets

DIFFERENTIAL AMPLIFIER CIRCUIT

BACKGROUND OF THE INVENTION

1. Field of the Invention

The present invention relates to a differential amplifier circuit for use in a semiconductor integrated circuit, and, more particularly, to a differential amplifier circuit used in a comparator circuit and an operational amplifier (hereafter abbreviated as "op amp") circuit.

2. Description of the Related Art

Referring to FIG. 1, a conventional op amp circuit 10 formed by MOS transistors shown. The op amp circuit 10 has first and second inputs Vin1, Vin2 and an output Vout. The output Vout is connected to the second input Vin2. In the op amp circuit 10, when an input signal Vin1 is at a higher level than an input signal Vin2 or an output signal Vout, the potential at a node N1 is reduced to decrease a drain current from a transistor Tr7, resulting in a decrease in the drain current from a transistor Tr10, which in turn increases the voltage level of the output signal Vout at an output terminal To.

On the other hand, when the input signal Vin1 is at a lower level than the input signal Vin2, the potential at the node N1 rises, which increases the drain current from the transistor Tr7, resulting in an increase in the drain current from the transistor Tr10, which reduces the voltage level of the output signal Vout at the output terminal To.

In this manner, the op amp circuit 10 operates to bring the voltage levels of both signals Vin1 and Vout substantially into coincidence with each other through the feedback of the output signal Vout. More specifically, a current source 1 supplies a constant current to the drain of an N-channel MOS transistor Tr1. Transistors Tr1, Tr2 have their gates connected together. The drain of the transistor Tr1 is connected to the gates of the transistors Tr1, Tr2. Both of the sources of the transistors Tr1, Tr2 are connected to the ground GND. Thus, the transistors Tr1, Tr2 form a current mirror circuit.

P-channel MOS transistors Tr3, Tr4 have sources connected to a power supply Vcc and gates connected to a drain of the transistor Tr3. The gates of the transistor Tr3, Tr4 are connected to each other. The drain of the transistor Tr3 is connected to the drain of the transistor Tr2. The transistors Tr3, Tr4 also form a current mirror circuit. The transistor Tr4 operates as a constant current source which passes a drain current equal to the current flow through the current source 1.

The drain of the transistor Tr4 is connected to the sources of P-channel MOS transistors Tr5, Tr6. The transistor Tr5 has a drain connected to the drain of the N-channel MOS transistor Tr7. The source of the transistor Tr7 is connected to the ground GND.

The drain of the transistor Tr6 is connected to the drain of an N-channel MOS transistor Tr8 and also connected to the gates of the transistors Tr7, Tr8. The transistor Tr8 has a source connected to the ground GND. The transistors Tr5, Tr6 have gates for receiving input signals Vin1, Vin2, respectively. Thus, the transistors Tr5 to Tr8 form a differential input circuit which is activated by the constant current supplied from the transistor Tr4.

The N-channel MOS transistor Tr10 has a gate connected to the drains of the transistors Tr5, Tr7, a drain connected to the power supply Vcc via a P-channel MOS transistor Tr9, and a source connected to the ground GND. The node N1 is defined as the junction between the transistors Tr5, Tr7 and Tr10.

The transistor Tr9 has a gate connected to the gates of the transistors Tr3, Tr4. A drain current which is the same as the drain currents from the transistors Tr3, Tr4 passes through the transistor Tr9 as an idling current.

The drain of the transistor Tr10 is connected to the output terminal To for the output signal Vout of the op amp circuit. The output signal Vout is fed back to the gate of the transistor Tr6.

Referring to FIG. 2, a second prior art op amp circuit 20 is shown The op amp circuit 20 includes the op amp circuit 10 of FIG. 1, to which a circuit 22 formed by N-channel MOS transistors Tr11 and Tr14 and P-channel MOS transistors Tr12, Tr13 and Tr15 is added. The added circuit 22 controls the drain current of the transistor Tr9 on the basis of the potential on the node N1.

The transistor Tr11 has a gate connected to the node N1, a source connected to the ground GND and a drain connected to the drain of the transistor Tr12 and to the gates of the transistors Tr12, Tr13. The transistors Tr12, Tr13 each have a source connected to the power supply Vcc. The transistors Tr12 and Tr13 form a current mirror circuit which passes a drain current equal to that of the transistor Tr11.

The transistor Tr14 has a drain connected to the drain of the transistor Tr13, a source connected to the ground GND and a gate connected to the gates of the transistors Tr1 and Tr2. Accordingly, the drain current from the transistor Tr14 is a constant current which is equal to the drain current from each of the transistors Tr1 and Tr2.

The transistor Tr15 has a drain connected to the drain of the transistor Tr14 and to the gates of the transistors Tr15 and Tr9, and a source connected to the power supply Vcc.

In the op amp circuit 20, the potential at the node N1 is reduced when the level of the input signal Vin1 is higher than that of the input signal Vin2, thereby resulting in a decrease in the drain current from the transistor Tr10, which reduces the drain current from the transistor Tr11 and also the drain currents from the transistors Tr12 and Tr13, and reduces the drain current from the transistor Tr15. As a consequence, the drain current from the transistor Tr9 increases, increasing the voltage level of the output signal Vout.

On the other hand, when the level of the input signal Vin1 is lower than that of the input signal Vin2, the potential at the node N1 rises, with a consequent increase in the drain current from the transistor Tr10. The drain current from the transistor Tr11 then increases, which in turn increases the drain currents from the transistors Tr12, Tr13, thus decreasing the drain current from the transistor Tr15. Consequently, the drain current from the transistor Tr9 decreases, reducing the voltage level of the output signal Vout.

In this manner, the transistors Tr7 and Tr10 operate in a push-pull mode in accordance with a change in the potential at the node N1 so as to bring the voltage levels of the input signal Vin1 and the output signal Vout substantially into coincidence with each other. Drain currents from the transistors Tr9, Tr10 are controlled in a manner depending on a load connected to the output terminal To, allowing an increase in the operating speed and a reduction in the power dissipation of the op amp circuit 20.

In the op amp circuit 20 described above, an offset voltage between the input signal Vin1 and the output signal Vout occurs as a result of a difference between the gate-source voltage Vgs of the transistor Tr5 and the gate-source voltage Vgs of the transistor Tr6. When the transistors Tr5 and Tr6 have an equal size, a difference in the gate-source voltage is caused by differences in the drain-source voltage and the drain current.

The drain voltage of the transistor Tr6 is determined by the gate-source voltage of the transistor Tr8, which is in turn determined by the magnitude of the current distributed by the transistor Tr4 to the transistors Tr5, Tr6. The magnitude of the current varies in a range from "0" to the drain current of the transistor Tr4.

On the other hand, the drain voltage of the transistor Tr5 is determined by the gate-source voltage of the output transistor Tr10, which is in turn determined by the drain voltage and the drain current of the output transistor Tr10. The drain voltage of the transistor Tr10 or the output voltage Vout undergoes a large variation in a range between the supply voltage Vcc and the ground GND. The drain current of the transistor Tr10 also undergoes a large variation in a range between "0" and the maximum drain current of the transistor Tr10, depending on a load connected to the output terminal To.

There is no correlation between factors which determine the respective drain voltages of the transistors Tr5, Tr6 which form the input differential pair. This causes a difference in the drain-source voltage to be produced between the transistors Tr5, Tr6, with resulting differences in the drain current and the gate-source voltage between both of the transistors Tr5, Tr6. This explains the occurrence of the offset voltage between the input signal Vin1 and the output signal Vout.

The offset voltage could be eliminated by adjusting the load condition such that the gate-source voltage is substantially equal for each of the transistors Tr8 and the transistor Tr10, but it is actually difficult to eliminate the offset voltage by constraining a load fluctuation within a given range.

The offset voltage does not remain constant for a change in the input signal, and thus the output signal does not follow the change in the input signal, presenting a problem that a linear input-output response cannot be obtained.

It is an object of the present invention to provide a differential amplifier circuit which suppresses the occurrence of an offset voltage between an input and an output and for providing a linear input-output response.

SUMMARY OF THE INVENTION

To achieve the above objective, the present invention provides a differential amplifier comprising: a differential input circuit having first and second input terminals for receiving first and second input signals, respectively, and amplifying a potential between the two input signals, and having first and second output terminals for outputting first and second voltage signals, respectively, the first and second voltage signals representing the amplified potential difference between the two input signals; first and second output transistors serially connected between a high potential power supply and a low potential power supply, the first transistor responsive to the first voltage signal output from the first output terminal; and a controller for receiving the first and second voltage signals output from the first and second output terminals and for controlling a current flowing to the second output transistor to cause the second voltage signal to substantially coincide with the first voltage signal based on the potential difference between the first and second voltage signals.

The present invention further provides a differential amplifier comprising: a differential input circuit having first and second input terminals for receiving first and second input signals, respectively, and amplifying a potential difference between the two input signals and generating first and second current signals therefrom which are output on first and second output terminals, respectively, wherein the first and second current signals represent the potential difference between the two input signals; a first output transistor connected between a high potential power supply and a low potential power supply, the first transistor responsive to the first current signal output from the first output terminal; a second output transistor serially connected to the first output transistor between the first output transistor and the low potential power supply; and a controller for receiving the first and second current signals output from the first and second output terminals, respectively, and for controlling a current signal flowing into the second output transistor to substantially coincide the second current signal with the first current signal based on the difference between the first and second current signals.

The present invention provides a differential amplifier comprising: a differential input circuit having first and second input terminals for receiving first and second input signals, respectively, and amplifying a potential between the first and second input signals, and having first and second output terminals for outputting first and second current signals, respectively, the first and second current signals representing the amplified potential difference between the two input signals; first and second output transistors serially connected between a high potential power supply and a low potential power supply, the first transistor responsive to the first current signal output from the first output terminal; and a controller for receiving the first and second current signals output from the first and second output terminals, respectively, and for controlling a current flowing to the second output transistor to cause the second current signal to substantially coincide with the first current signal based on the potential difference between the first and second current signals.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 3:
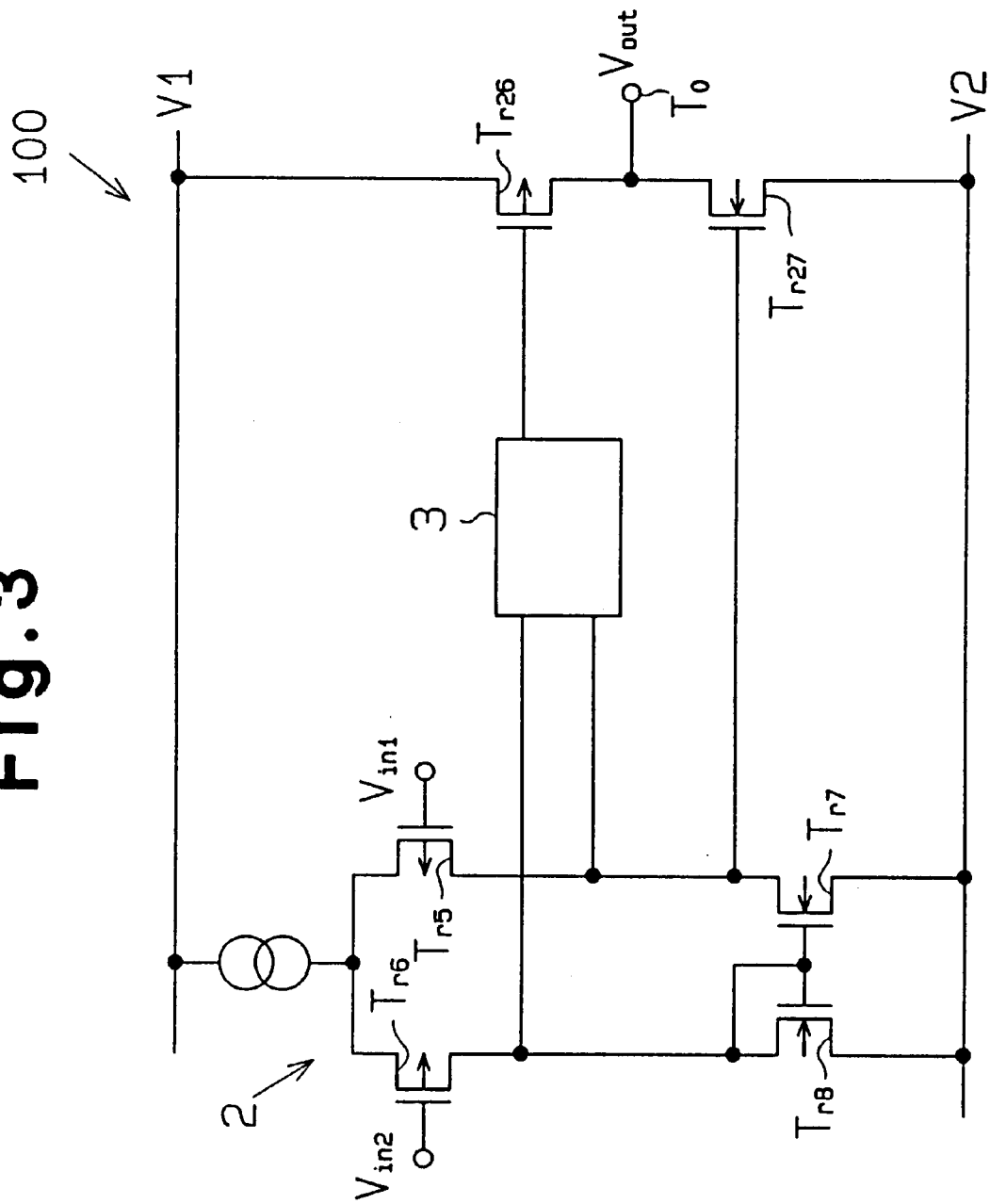
FIG. 3 is a circuit diagram of an op amp circuit in accordance with a first embodiment of the present invention.

Initially the concept of the invention will be described with reference to FIG. 3.

A differential amplifier circuit 100 comprises a differential input circuit 2 formed by first and the second input transistors Tr5 and Tr6, a detection and control circuit 3, and first and second output transistors Tr27, Tr26. The differential input circuit 2 amplifies a potential difference between an input signal Vin1 applied to the first input transistor Tr5 and an input signal Vin2 applied to the second input transistor Tr6 and delivers the difference as an output. The first and second output transistors Tr27, Tr26 are connected to an output terminal To and are operable to provide a pull-up operation to pull up an output terminal voltage Vout and a pull-down operation to pull down the output terminal voltage Vout on the basis of the drain voltages of the first and the second input transistors Tr5, Tr6.

The Transistors Tr7, Tr8 are connected to the drains of the input transistors Tr5, Tr6, respectively. The drain of the first input transistor Tr5 is connected to the gate of the second output transistor Tr26. The detection and control circuit 3 controls the drain current of the first output transistor Tr27 on the basis of a difference between the drain voltages or drain currents of the first and the second input transistors Tr5, Tr6 so that the drain voltages or the drain currents of the first and the second input transistors Tr5, Tr6 are brought substantially into coincidence.

Figure 1:
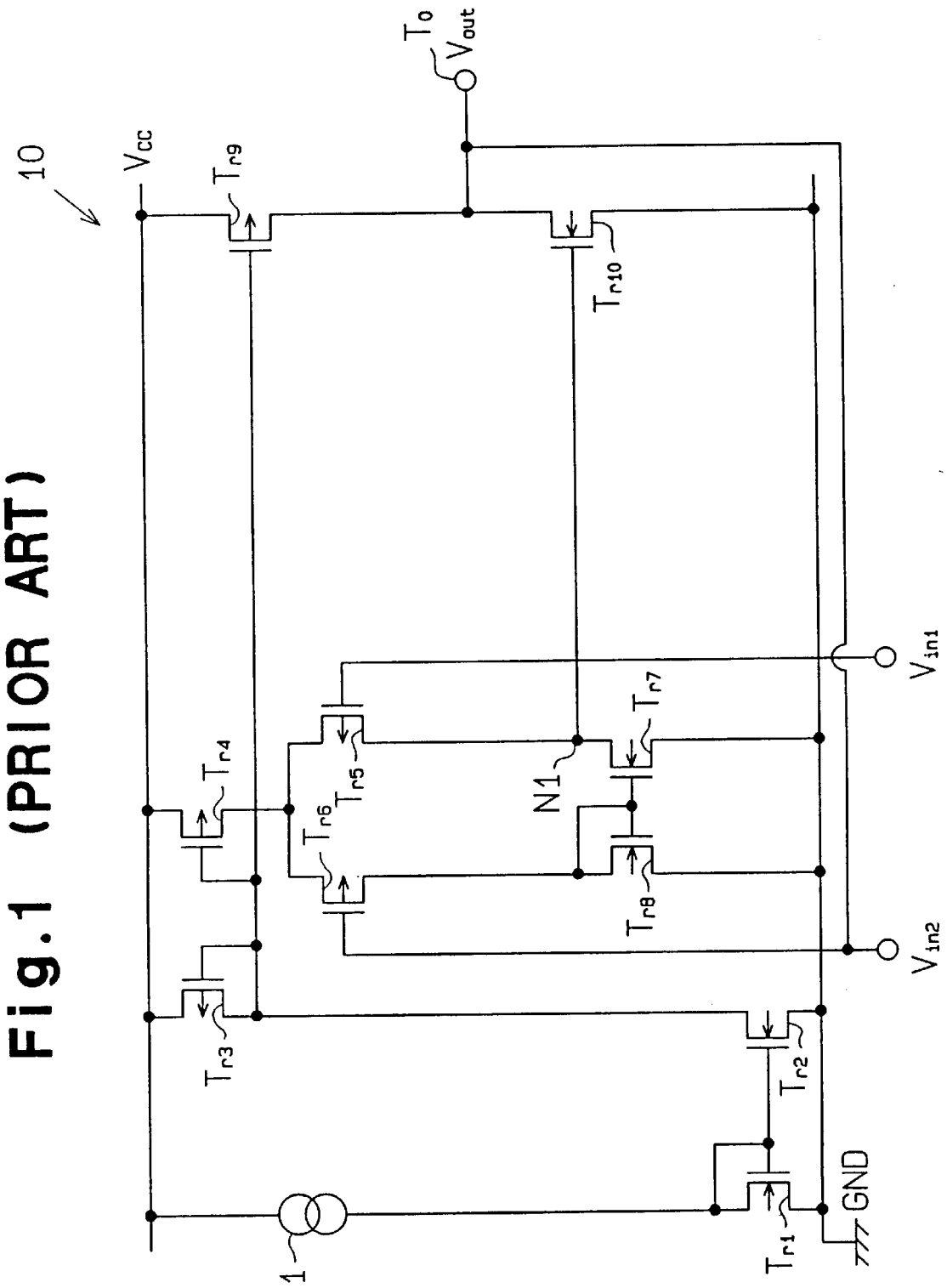
FIG. 1 is a circuit diagram of a first prior art of op amp circuit.
Figure 2:
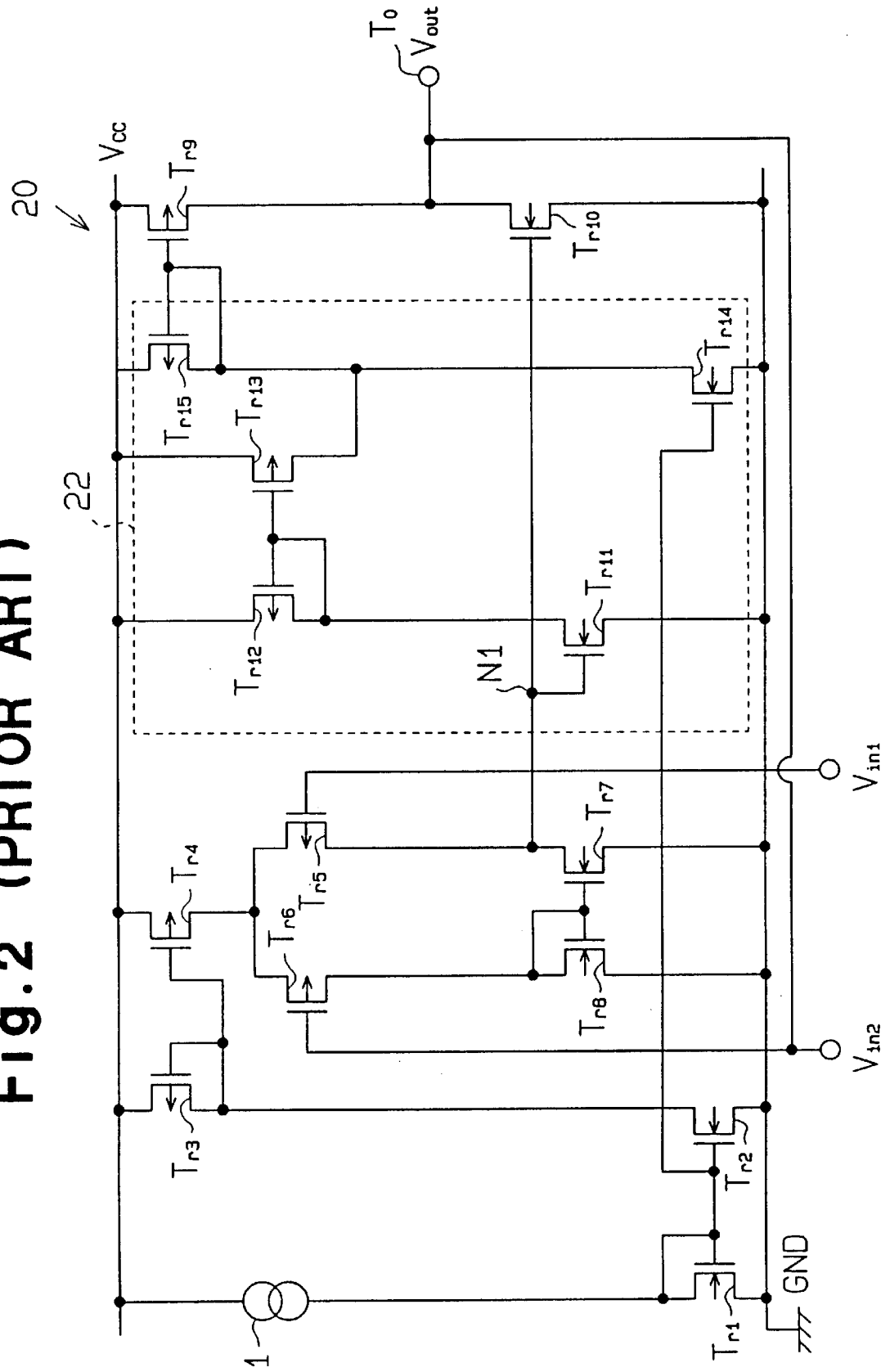
FIG. 2 is a circuit diagram of a second prior art of op amp circuit.
Figure 4:
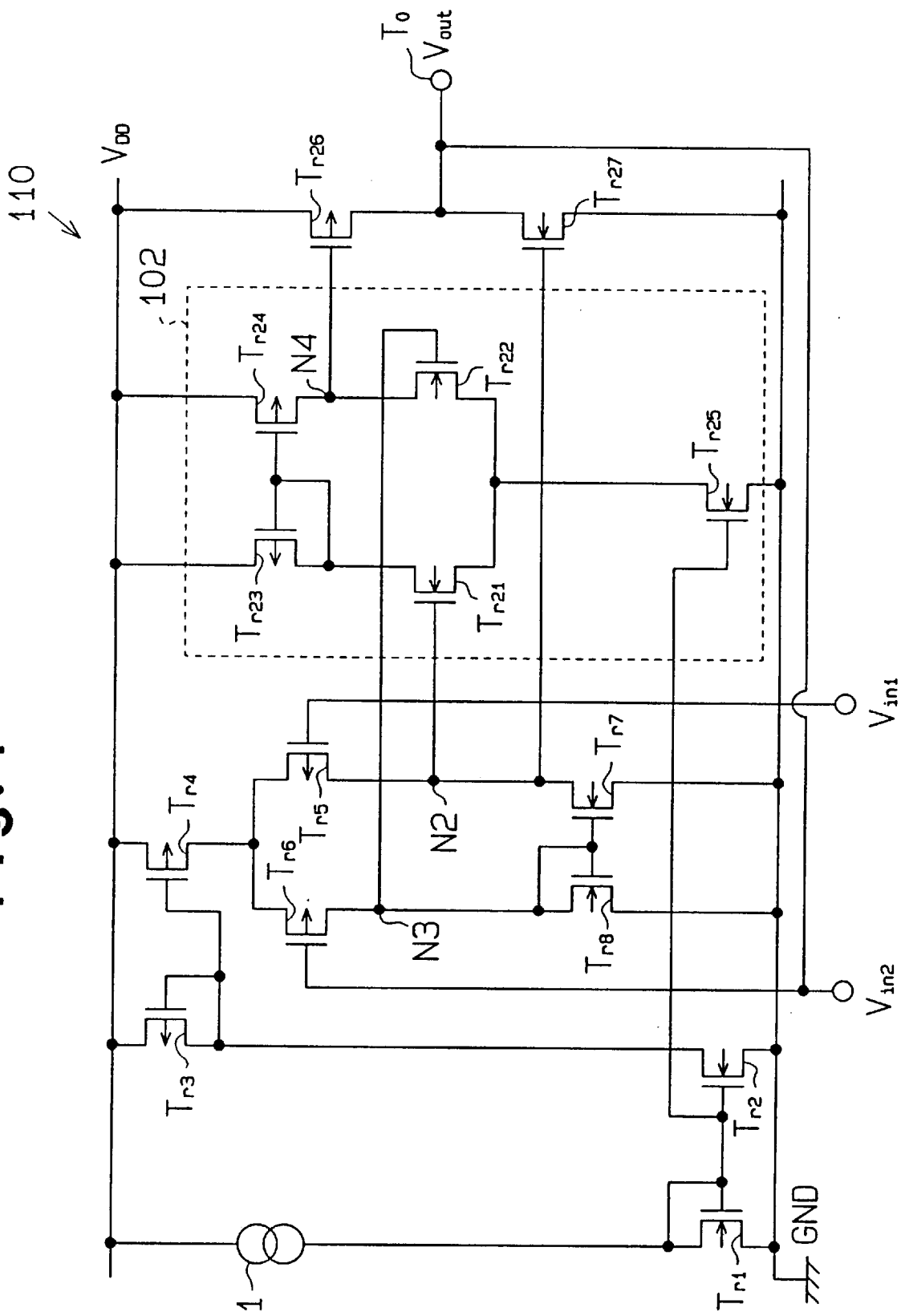
FIG. 4 is a circuit diagram of an op amp circuit according to a second embodiment of the present invention.

Referring now to FIG. 4, a differential amplifier circuit 110 according to one embodiment of the present invention will now be described. A differential input circuit including the transistors Tr1 to Tr8 is arranged in the same manner as described above in connection with the prior art op amp circuit 10 (FIG. 1).

An input N-channel MOS transistor Tr21 has a gate connected to a node N2 between the drains of the transistors Tr5, Tr7. An N-channel MOS transistor Tr22 has a gate connected to a node N3 between the drains of the transistors Tr6, Tr8. Transistors Tr21, Tr22 have sources connected to the drain of an N-channel MOS transistor Tr25. The transistor Tr25 has a source connected to the ground GND and a gate connected to the gates of the transistors Tr1, Tr2. The transistor Tr25 operates as a constant current source passing a drain current that is substantially equal to the drain currents of the transistors Tr1, Tr2.

P-channel MOS transistors Tr23, Tr24 each have a source connected to the power supply Vcc, and gates connected to each other and to the drain of the transistor Tr21. The transistor Tr23 has a drain connected to the drain of the transistor Tr21 and to its own gate, and the transistor Tr24 has a drain connected to the drain of the transistor Tr22. A node N4 is defined at the junction between the drains of the transistors Tr22 and Tr24.

The transistors Tr21 to Tr25 form a detection and control circuit 102 for detecting a potential difference between the nodes N2, N3 or a difference between the drain currents of the transistors Tr5, Tr6. When the potential at the node N2 is higher than the potential at the node N3 or when the drain current of the transistor Tr5 is greater in magnitude than the drain current of the transistor Tr6, the potential at the node N4 rises. By contrast, when the potential at the node N2 is lower than the potential at the node N3 or when the drain current of the transistor Tr5 is smaller than the drain current of the transistor Tr6, the potential at the node N4 falls.

The pull-up output transistor Tr26 is a P-channel MOS transistor having a gate connected to the node N4, a source connected to the power supply Vcc and a drain connected to the output terminal To.

The pull-down output transistor Tr27 is an N-channel MOS transistor having a gate connected to the node N2, a drain connected to the output terminal To and a source connected to the ground GND.

The operation of the differential amplifier 110 circuit will now be described.

Under the condition that the output signal Vout converges to the voltage level of the input signal Vin1, if the voltage level of the input signal Vin1 rises, the drain current of the transistor Tr5 decreases and becomes less than the drain current of the transistor Tr6, whereupon the voltage level at the node N2 falls to turn the transistor Tr27 off. Since the potential at the node N3 is higher than the potential at the node N2 at this time, the drain current of the transistor Tr22 increases to reduce the potential at the node N4, thus turning the output transistor Tr26 on. As a consequence, the voltage level of the output signal Vout rises, converging to the input signal Vin1.

On the other hand, under the condition that the output signal Vout converges to the voltage level of the input signal Vin1, if the voltage level of the input signal Vin1 falls, the drain current of the transistor Tr5 increases and becomes greater than the drain current of the transistor Tr6, whereupon the voltage level at the node N2 rises to turn the transistor Tr27 on. Since the potential at the node N3 is lower than the potential at the node N2 at this time, the drain current of the transistor Tr22 decreases to raise the potential at the node N4, thus turning the output transistor Tr26 off. As a consequence, the voltage level of the output signal Vout falls, converging to the input signal Vin1.

When the drain potentials (or currents) of the transistors Tr5, Tr6 are different under the condition that the output signal Vout converges to the voltage level of the input signal Vin1, the detection and control circuit 102 eliminates the potential difference (or difference in the drain current).

When the potential at the node N2 is higher than the potential at the node N3, the potential at the node N4 rises, whereby the drain current fed from the transistor Tr26 to the transistor Tr27 decreases. A reduction in the drain current of the transistor Tr27 reduces the gate-source voltage of the transistor Tr27, such that the potential at the node N2 or the drain current of the transistor Tr5 is reduced.

Conversely, when the potential at the node N2 is lower than the potential at the node N3, the potential at the node N4 falls, whereby the drain current fed from the transistor Tr26 to the transistor Tr27 increases. An increase in the drain current of the transistor Tr27 increases the gate-source voltage of the transistor Tr27, such that the potential at the node N2 rises or the drain current of the transistor Tr6 increases.

As a result of the described operations, the potentials at the nodes N2, N3 converge to a substantially equal potential. This causes the transistors Tr5, Tr6 to assume an equal drain potential, whereby the source-drain voltages, and hence the drain currents, become substantially equal to each other for the transistors Tr5, Tr6. Consequently, the gate-source voltage is substantially equal between the transistors Tr5, Tr6, thus eliminating an offset voltage between the input signal Vin1 and the output signal Vout. Elimination of the offset voltage enables a linear input-output response to be obtained.

It should be apparent to those skilled in the art that the present invention may be embodied in other specific forms without departing from the spirit or scope of the invention. Particularly, it should be understood that the invention may be embodied in the following forms.

The differential input circuit to which the input signals Vin1, Vin2 are applied may comprise a pair of N-channel MOS transistors. Alternatively, the gate-source voltage of the pull-up output transistor Tr26 may be controlled by controlling the drain current of the pull-down output transistor Tr27 with the detection and control circuit 102 in order to achieve a substantial coincidence of the drain voltages of the input transistors. Both pull-up and pull-down output transistors may comprise N-channel MOS transistors. In this instance, by controlling the drain current of either one of the output transistors with the detection and control circuit 102, the gate-source voltage of the other output transistor is controlled. Again, the drain voltages of the first and the second input transistors are brought substantially into coincidence.

Therefore, the present examples and embodiments are to be considered as illustrative and not restrictive and the invention is not to be limited to the details given herein, but may be modified within the scope and equivalence of the appended claims.

What is claimed is:

1. A differential amplifier comprising:
   a differential input circuit having first and second input terminals for receiving first and second input signals, respectively, and amplifying a potential between the two input signals, and having first and second output terminals for outputting first and second voltage signals, respectively, the first and second voltage signals representing the amplified potential difference between the two input signals;
   first and second output transistors serially connected between a high potential power supply and a low potential power supply, the first transistor responsive to the first voltage signal output from the first output terminal; and
   a controller for receiving the first and second voltage signals output from the first and second output terminals and for controlling a current flowing to the second output transistor to cause the second voltage signal to substantially coincide with the first voltage signal based on the potential difference between the first and second voltage signals.

2. The differential amplifier according to claim 1, wherein the controller includes a circuit for receiving the first and second voltage signals and amplifying the potential difference between the first and second voltages.

3. The differential amplifier according to claim 1, wherein a node between the first and second output transistors is connected to an external output terminal, wherein the first output transistor includes a pull-down transistor for pulling-down the voltage of the external output terminal, and wherein the second output transistor includes a pull-up transistor for pulling-up the voltage of the external output terminal.

4. The differential amplifier according to claim 1, wherein the controller reduces a current flowing to the second output terminal when the level of the first voltage signal is higher than that of the second voltage signal, and wherein the controller increases a current flowing to the second output terminal when the level of the first voltage signal is lower than that of the second voltage signal.

5. The differential amplifier according to claim 4, wherein the first output transistor is responsive to the first voltage signal, and wherein the first output transistor adjusts the second voltage signal to substantially coincide with the first voltage signal, in response to the first voltage signal.

6. The differential amplifier according to claim 5, wherein the first output transistor includes an N-channel MOS transistor, and the second output transistor includes a P-channel MOS transistor.

7. The differential amplifier according to claim 6, wherein the first output transistor includes a gate terminal for receiving the first voltage signal and a drain terminal for receiving a current corresponding to the level of the first voltage signal.

8. The differential amplifier according to claim 5, further comprising an external output terminal connected to a node between the first and second output transistors, and wherein the external output terminal is connected to one of the first and second input terminals.

9. A differential amplifier comprising:
   a differential input circuit having first and second input terminals for receiving first and second input signals, respectively, and amplifying a potential difference between the two input signals and generating first and second current signals therefrom which are output on first and second output terminals, respectively, wherein the first and second current signals represent the potential difference between the two input signals;
   a first output transistor connected between a high potential power supply and a low potential power supply, the first transistor responsive to the first current signal output from the first output terminal;
   a second output transistor serially connected to the first output transistor between the first output transistor and the low potential power supply; and
   a controller for receiving the first and second current signals output from the first and second output terminals, respectively, and for controlling a current signal flowing into the second output transistor to substantially coincide the second current signal with the first current signal based on the difference between the first and second current signals.

10. The differential amplifier according to claim 9, wherein the controller includes a circuit for receiving the first and second current signals and amplifying the potential difference between the first and second input signals.

11. The differential amplifier according to claim 9, wherein a node between the first and second output transistors is connected to an external output terminal, wherein the first output transistor includes a pull-down transistor for pulling-down the voltage of the exterfnal output terminal, and wherein the second output transistor includes a pull-up transistor for pulling-up the voltage of the external output terminal.

12. The differential amplifier according to claim 9, wherein the controller reduces the second current flowing to the second output terminal when the level of the first current signal is higher than that of the second current signal, and wherein the controller increases second current flowing to the second output terminal when the level of the first current signal is lower than that of the second current signal.

13. The differential amplifier according to claim 9, wherein the first output transistor is responsive to the first current signal, and wherein the first output transistor adjusts the second current signal to substantially coincide with the first current signal, in response to the first current signal.

14. The differential amplifier according to claim 13, wherein the first output transistor includes an N-channel MOS transistor, and the second output transistor includes a P-channel MOS transistor.

15. The differential amplifier according to claim 14, wherein the first output transistor includes a gate terminal for receiving the first current signal and a drain terminal for receiving a current corresponding to the level of the first current signal.

16. The differential amplifier according to claim 13, further comprising an external output terminal connected to a node between the first and second output transistors, and wherein the external output terminal is connected to one of the first and second input terminals.

17. A differential amplifier comprising:
   a differential input circuit having first and second input terminals for receiving first and second input signals, respectively, and amplifying a potential between the first and second input signals, and having first and second output terminals for outputting first and second current signals, respectively, the first and second current signals representing the amplified potential difference between the two input signals;

first and second output transistors serially connected between a high potential power supply and a low potential power supply, the first transistor responsive to the first current signal output from the first output terminal; and a controller for receiving the first and second current signals output from the first and second output terminals, respectively, and for controlling a current flowing to the second output transistor to cause the second current signal to substantially coincide with the first current signal based on the potential difference between the first and second current signals.

* * * * *